United States Patent

Gnannt et al.

[11] Patent Number: 5,965,929
[45] Date of Patent: Oct. 12, 1999

[54] BIPOLAR SILICON TRANSISTOR WITH ARSENIC AND PHOSPHOROUS RATIO

[75] Inventors: Klaus Gnannt, Stadtbergen; Jakob Huber, Beyharting, both of Germany

[73] Assignee: Siemens Aktiengesellschaft, Munich, Germany

[21] Appl. No.: 08/623,905

[22] Filed: Mar. 27, 1996

[30] Foreign Application Priority Data

Mar. 27, 1995 [DE] Germany .............................. 195 11 251

[51] Int. Cl.$^6$ ....................... H01L 27/082; H01L 27/102; H01L 29/70; H01L 31/11
[52] U.S. Cl. .................. 257/565; 257/578; 257/590; 257/591; 257/593; 257/919
[58] Field of Search ....................... 257/565, 591, 257/578, 590, 593, 919

[56] References Cited

U.S. PATENT DOCUMENTS

| | | | |
|---|---|---|---|
| 4,875,085 | 10/1989 | Ueno et al. ............................... | 357/34 |
| 5,047,357 | 9/1991 | Eklund ..................................... | 437/31 |
| 5,150,184 | 9/1992 | Eklund ..................................... | 357/34 |

FOREIGN PATENT DOCUMENTS

| | | |
|---|---|---|
| 0 018 520 A1 | 11/1980 | European Pat. Off. . |
| 0 108 204 | 5/1984 | European Pat. Off. . |
| 0 378 164 A3 | 7/1990 | European Pat. Off. . |

OTHER PUBLICATIONS

Patent Abstracts of Japan 59087856 (Shinada), dated May 21, 1984.

*Primary Examiner*—William Mintel
*Attorney, Agent, or Firm*—Herbert L. Lerner; Laurence A. Greenberg

[57] ABSTRACT

A bipolar silicon transistor includes at least one emitter zone with $n^+$ arsenic doping and with a phosphorus doping. The ratio between arsenic dopant concentration and phosphorus dopant concentration is between 10:1 and 500:1 in the at least one emitter zone. The at least one emitter zone may also have a penetration depth of less than 0.5 $\mu$m. A method for producing a bipolar silicon transistor includes implanting a $n^+$-doped emitter zone with arsenic, implanting the $n^+$-doped emitter zone with phosphorus, setting a ratio in the $n^+$-doped emitter zone between the arsenic dopant concentration and phosphorus dopant concentration to between 10:1 and 500:1, and annealing crystal defects.

6 Claims, 2 Drawing Sheets

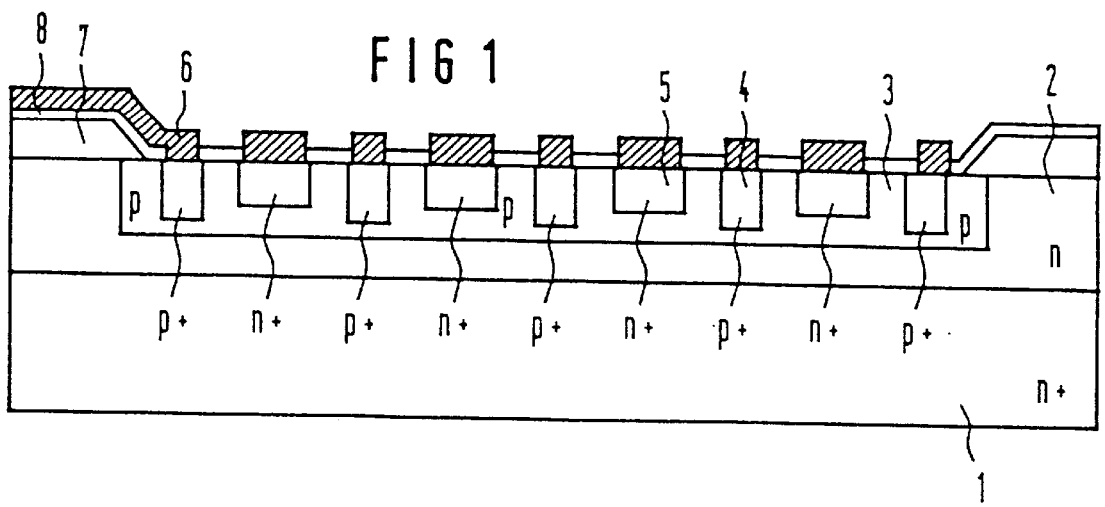
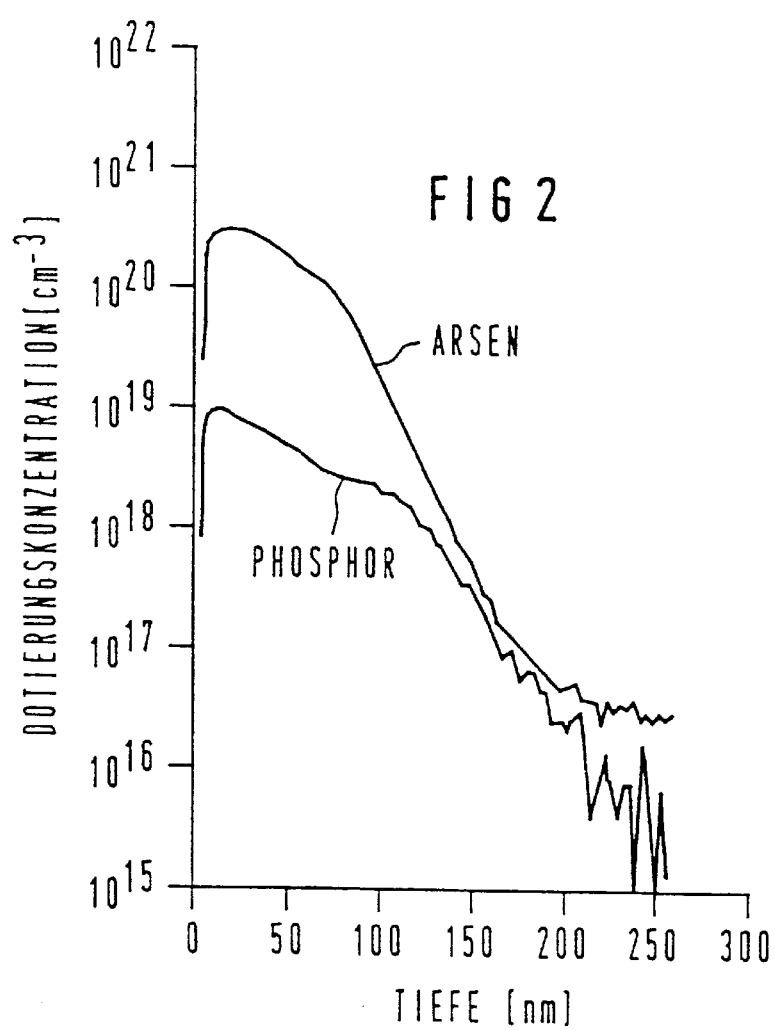

BIPOLAR SILICON TRANSISTOR WITH ARSENIC AND PHOSPHOROUS RATIO

BACKGROUND OF THE INVENTION

FIELD OF THE INVENTION

The invention relates to a bipolar silicon transistor having at least one emitter zone with $n^+$ arsenic doping.

One such silicon transistor is known, for instance, from Einführung in die Halbleitertechnologie (Introduction to Semiconductor Technology) by W. von Münch, Teubner-Verlag, Stuttgart 1993, pp. 208 and 209. That publication describes a bipolar silicon high-frequency transistor with a comb-like arsenic-doped emitter structure. The emitter zones have a very steep doping profile with a low penetration depth (<0.6 $\mu$m). Those properties are highly significant for the high-frequency compatibility of the transistor.

The advantage of arsenic as a dopant is based on its low, concentration-dependent diffusion speed, which makes it possible to attain the doping profiles described above. Ion implantation is often employed as a method for producing such doping profiles.

At very high implantation doses, as required, for instance, for an emitter of an HF transistor, crystal damage remains behind in the silicon crystal after an annealing process that can be used for the above-described doping profile. However, crystal damage often leads to impairment of the functional properties of the transistor. Crystal defects located in the region of the emitter, for instance, cause increased leakage currents through the emitter-to-base diode. Moreover, crystal defects in the region of the emitter increases recombination in the emitter volume and causes the current intensity to drop. Such a drop in current intensity has a comparatively marked effect at low currents, resulting in a nonlinear course of the current intensity over the operating current. Moreover, crystal damage can even impair the function of the collector-to-base diode.

The number and electrical effectiveness of crystal defects is generally reduced in semiconductor technology by annealing at adequately high temperatures. For the above-described doping profile, however, no perfect annealing processes exist, since the demand for a large gradient in the drop-off of arsenic dopant concentration in the interior of the silicon crystal and the demand for a low penetration depth of the arsenic dopant does not allow the use of adequately high temperatures and/or adequately long annealing times. The frequency of defects in the known silicon transistors with an emitter $n^+$ doped with arsenic is therefore very high, which makes for a low production yield.

SUMMARY OF THE INVENTION

It is accordingly an object of the invention to provide a silicon transistor having an emitter zone that, despite a high arsenic dopant concentration, has a low number of crystal defects in the silicon crystal, which overcomes the hereinafore-mentioned disadvantages of the heretofore-known methods and devices of this general type and without which long annealing times varying the doping profile substantially would be required.

With the foregoing and other objects in view there is provided, a bipolar silicon transistor, comprising: at least one emitter zone with $n^+$ arsenic doping and with a phosphorus doping, and the at least one emitter zone having a ratio between arsenic dopant concentration and phosphorus dopant concentration of between 10:1 and 500:1.

The addition of a small quantity of phosphorus means that fewer displacements and fewer mechanical strains arise in the silicon crystal. Consequently the likelihood of damage to a transistor from crystal defects is also markedly reduced.

In accordance with an added feature of the invention, the at least one emitter zone has a penetration depth of less than 0.5 $\mu$m.

With the objects of the invention in view, there is also provided a method for producing a bipolar silicon transistor which comprises, implanting an $n^+$-doped emitter zone with arsenic, implanting the $n^+$-doped emitter zone with phosphorus, setting a ratio in the $n^+$-doped emitter zone between the arsenic dopant concentration and phosphorus dopant concentration to between 10:1 and 500:1, and annealing crystal defects.

In accordance with an added feature of the invention, the method for producing a bipolar silicon transistor includes implanting arsenic in an arsenic dose of between 2e15 $cm^{-2}$ and 1e16 $cm^{-2}$ with an energy of up to 50 keV, in the arsenic implanting step.

In accordance with an additional feature of the invention, the method for producing a bipolar silicon transistor includes implanting phosphorous in a phosphorus dose of between 1e13 $cm^{-2}$ and 5e14 $cm^{-2}$ with an energy of less 25 keV, in the phosphorous implanting step.

In accordance with another feature of the invention, the method for producing a bipolar silicon transistor includes setting a penetration depth to less than 0.5 $\mu$m, before the annealing step.

Other features which are considered as characteristic for the invention are set forth in the appended claims.

Although the invention is illustrated and described herein as constructed in a bipolar silicon transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, cross-sectional view of a bipolar silicon transistor according to the invention;

FIG. 2 is a graph of an arsenic doping profile and a phosphorus doping profile for an $n^+$-doped emitter of a bipolar; silicon transistor according to the invention;

DESCRIPTION OF THE PREFERRED EMBODIMENTS

Figure 3:
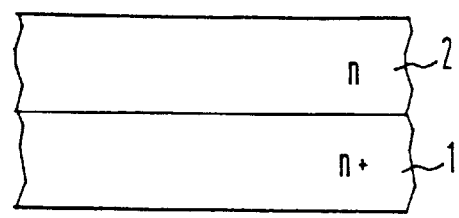
FIG. 3. is a partial, cross-sectional view of a bipolar silicon transistor after step a) of a method to produce the bipolar silicon transistor according to the invention.

Referring now to the figures of the drawings in detail and first, particularly, to FIG. 1 thereof, there is seen a bipolar silicon transistor constructed on an n+-doped silicon substrate 1. A collector layer 2 of n-doped silicon is applied, for instance epitaxially, to the silicon substrate 1. A p-doped base zone 3 is embedded in the collector layer 2. The penetration depth of the base zone 3 is about 0.5 μm. The p-doped base zone 3 is doped with boron, for instance. In the p-doped base zone 3, p+-doped base contact zones 4 and n+-doped emitter zones 5 are embedded. The p+-doped base contact zones 4 are doped with boron, for instance, and the n+-doped emitter zones 5 are doped with arsenic and phosphorus. The n+-doped emitter zones 5, for instance about 15 nm below the surface of an emitter zone 5, have a peak arsenic dopant concentration of about $3e20$ $cm^{-3}$ and a peak phosphorus dopant concentration of about $1e19$ $cm^{-3}$. The metallurgical penetration depth of the emitter zones 5, defined by the location of the base-to-emitter pn junction, is about 0.25 μm. Insulating layer 7 is deposited on the base zone 3 and the collector layer 2. Insulating layer 8 is deposited on the base zone 3 and the insulating layer 7 with strip-like windows for the base contact zones 4 and the emitter zones 5. Terminal metallizings 6, such as a gold/platinum/titanium alloy, are applied to the base contact zones 4 and the emitter zones 5.

FIG. 2 illustrates the arsenic doping profile and the phosphorus doping profile of emitter zones 5. Beginning at the peak arsenic dopant concentration of about $3e20$ $cm^{-3}$, the arsenic dopant concentration drops within 80 nm by only one power of 10, to about $3e19$ $cm^{-3}$. After that, within about 130 nm, it drops by three powers of 10 to about $3e16$ $cm^{-3}$. Beginning at the peak phosphorus dopant concentration of about $1e19$ $cm^{-3}$, the phosphorus dopant concentration drops within about 120 nm by only one power of 10, to about $1e18$ $cm^{-3}$. After that, within about 80 nm, it drops by two powers of 10 to about $2e16$ $cm^{-3}$. The phosphorus doping profile has no substantial influence on the characteristic of the base-to-emitter pn junction.

Figure 4:
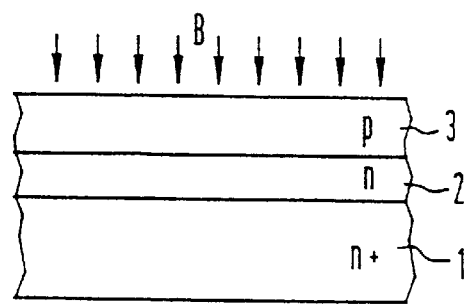
FIG. 4. is a partial, cross-sectional view of a bipolar silicon transistor after step b) of a method to produce the bipolar silicon transistor according to the invention.
Figure 5:
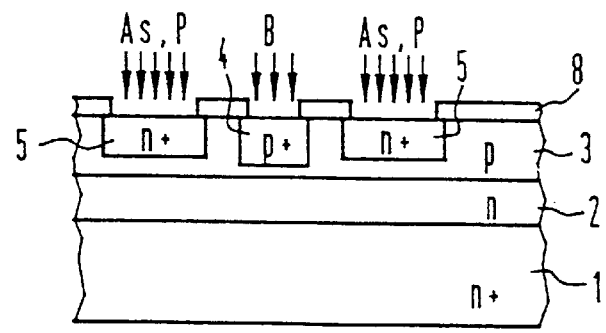
FIG. 5. is a partial, cross-sectional view of a bipolar silicon transistor after steps c)–e) of a method to produce the bipolar silicon transistor according to the invention.
Figure 6:
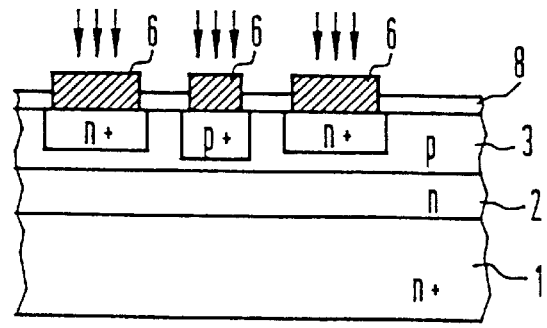
FIG. 6. is a partial, cross-sectional view of a bipolar silicon transistor after step g) of a method to produce the bipolar silicon transistor according to the invention.

A method for producing the above-described bipolar silicon transistor, illustrated in FIGS. 3–6, has the following successive steps, for example.

a) Apply an n-doped collector layer 2 onto a n+-doped substrate 1 epitaxially (see FIG. 3).

b) Implant a p-doped base zone 3 with boron and then anneal (see FIG. 4).

c) Deposit an insulating layer 7 (non-illustrated) and deposit an insulating layer 8 with strip-like windows for base contact zones 4 and emitter zones 5 (see FIG. 5). Insulating layers 7 and 8 are silicon oxide and/or silicon nitride.

d) Implant boron into the base contact zones 4 (FIG. 5).

e) Implant an arsenic dose of between $2e15$ $cm^{-2}$ and $1e16$ $cm^{-2}$ with an energy of up to 50 keV and a phosphorus dose of between $1e13$ $cm^{-2}$ and $5e14$ $cm^{-2}$ with an energy of less than 25 keV into the emitter zones 5 (FIG. 5).

f) Anneal the implantation damage by tempering at 900° C. for a duration of about 10 minutes.

g) Vapor deposit the terminal metallizing 6 (FIG. 6).

As an alternative to step f) of the method, a so-called rapid thermal annealing process (RTA) may be used to anneal the implantation damage. The silicon transistor is heated in a chamber with powerful lamps, whose light is concentrated on the silicon transistor, to above 1000° C. within a few seconds, is briefly maintained at this high temperature, and then is rapidly cooled again. A combination of this method and the furnace process of step f) may also be employed.

We claim:

1. A bipolar silicon transistor, comprising:

an emitter zone with an n+ arsenic dopant concentration and with a phosphorus dopant concentration;

said emitter zone having a ratio of said arsenic dopant concentration to said phosphorus dopant concentration of between 10:1 and 500:1;

said emitter zone having a surface;

said emitter zone having an outer periphery adjacently below said surface;

said arsenic dopant concentration greater than said phosphorous dopant concentration within said outer periphery of said emitter zone.

2. The bipolar silicon transistor according to claim 1, wherein said at least one emitter zone has a penetration depth of less than 0.5 μm.

3. The bipolar silicon transistor according to claim 1, wherein said arsenic dopant concentration has a peak concentration of about $3e20$ $cm^{-3}$ and said phosphorous dopant concentration has a peak concentration of about $1e19$ $cm^{-3}$.

4. The bipolar silicon transistor according to claim 1, wherein said emitter zone has an outer continuous side extending to said surface.

5. The bipolar silicon transistor according to claim 1, wherein said emitter zone includes a bottom and an outer planar side extending from said bottom to said surface.

6. A bipolar silicon transistor, comprising:

an emitter zone including a single section having an n+ arsenic dopant concentration and having a phosphorus dopant concentration; and said single section of said emitter zone having a ratio of said arsenic dopant concentration to said phosphorus dopant concentration of between 10:1 and 500:1.

* * * * *